(12) United States Patent
Huang et al.

(10) Patent No.: US 12,298,615 B2
(45) Date of Patent: May 13, 2025

(54) WINDOW AND TRANSPARENT DISPLAY DEVICE

(71) Applicant: Innolux Corporation, Miao-Li County (TW)

(72) Inventors: Yu-Chia Huang, Miao-Li County (TW); Tsung-Han Tsai, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 0 days.

(21) Appl. No.: 18/362,990

(22) Filed: Aug. 1, 2023

(65) Prior Publication Data

US 2023/0408858 A1 Dec. 21, 2023

Related U.S. Application Data

(63) Continuation of application No. 17/553,831, filed on Dec. 17, 2021, now Pat. No. 11,754,871.

(30) Foreign Application Priority Data

Jan. 13, 2021 (CN) .......................... 202110043928.8

(51) Int. Cl.
| | |
|---|---|
| *G02F 1/1335* | (2006.01) |
| *B60J 3/00* | (2006.01) |
| *G02F 1/153* | (2006.01) |
| *G02F 1/157* | (2006.01) |
| *H10K 50/84* | (2023.01) |
| *H10K 59/126* | (2023.01) |

(52) U.S. Cl.
CPC ........ *G02F 1/133509* (2013.01); *B60J 3/007* (2013.01); *G02F 1/133512* (2013.01); *G02F 1/1533* (2013.01); *H10K 50/841* (2023.02); *H10K 59/126* (2023.02); *G02F 2001/1536* (2013.01); *G02F 1/157* (2013.01); *G02F 2201/086* (2013.01); *G02F 2201/44* (2013.01)

(58) Field of Classification Search
None
See application file for complete search history.

(56) References Cited

U.S. PATENT DOCUMENTS

| | | | | |
|---|---|---|---|---|
| 2017/0077442 | A1* | 3/2017 | Zhao | H10K 50/8426 |
| 2017/0153668 | A1* | 6/2017 | Jang | G06F 1/1641 |
| 2017/0322354 | A1* | 11/2017 | Choi | G02B 5/208 |
| 2021/0149511 | A1* | 5/2021 | Chung | G06F 3/0416 |
| 2021/0402206 | A1* | 12/2021 | Goya | A61N 5/06 |
| 2022/0393139 | A1* | 12/2022 | Mok | B32B 27/08 |
| 2023/0006157 | A1* | 1/2023 | Kino | G09F 9/30 |

FOREIGN PATENT DOCUMENTS

| | | | |
|---|---|---|---|
| CN | 111223396 A | * | 6/2020 |
| KR | 20180051313 A | * | 5/2018 |

* cited by examiner

*Primary Examiner* — Shan Liu
(74) *Attorney, Agent, or Firm* — JCIPRNET

(57) ABSTRACT

A window is provided. The window includes a transparent display panel, a transparent substrate, and an ultraviolet light shielding layer. The transparent substrate is disposed on the transparent display panel. The ultraviolet light shielding layer is disposed between the transparent substrate and the transparent display panel.

9 Claims, 10 Drawing Sheets

WINDOW AND TRANSPARENT DISPLAY DEVICE

CROSS-REFERENCE TO RELATED APPLICATION

This application is a continuation application of and claims the priority benefit of U.S. application Ser. No. 17/553,831, filed on Dec. 17, 2021, which claims the priority benefit of China patent application serial no. 202110043928.8, filed on Jan. 13, 2021. The entirety of each of the above-mentioned patent applications is hereby incorporated by reference herein and made a part of this specification.

BACKGROUND

Technical Field

The disclosure relates to a window and a display device, and in particular, relates to a window and a transparent display device.

Description of Related Art

As applications of electronic devices continue to expand, development of display technology changes rapidly. The electronic devices are thus required to provide improved structures and enhanced quality in order to satisfy expanded application needs and users' habits and demands, and the electronic devices are thus faced with different problems. Therefore, research and development of the electronic devices have to be continuously updated and adjusted.

SUMMARY

The disclosure is directed to a window exhibiting good structural reliability or display quality.

The disclosure is directed to a transparent display device exhibiting good structural reliability or display quality.

According to an embodiment of the disclosure, a window includes a transparent display panel, a transparent substrate, and an ultraviolet light shielding layer. The transparent substrate is disposed on the transparent display panel. The ultraviolet light shielding layer is disposed on the transparent display panel.

According to an embodiment of the disclosure, the window includes a transparent substrate, a transparent display panel, and an ultraviolet light shielding layer. The transparent display panel is disposed on one side of the transparent substrate. The ultraviolet light shielding layer is disposed on another side of the transparent display panel.

According to an embodiment of the disclosure, the transparent display device includes a transparent display panel and an ultraviolet light shielding layer. The ultraviolet light shielding layer is fixed on one side of the transparent display panel.

Based on the above, in the window or the transparent display device according to an embodiment of the disclosure, since the ultraviolet light shielding layer is completely overlapped with an active region of the transparent display panel and the ultraviolet light shielding layer may be completely located between an ambient light source and the transparent display panel, ultraviolet light in the incident light irradiated to the transparent display panel and the active region thereof may be reduced. In this way, deterioration of the transparent display panel and the electronic components in the active region thereof caused by irradiation of ultraviolet light may be reduced. Therefore, the structural reliability or display quality of the transparent display panel may be improved. The window or the transparent display device may exhibit good structural reliability or display quality.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
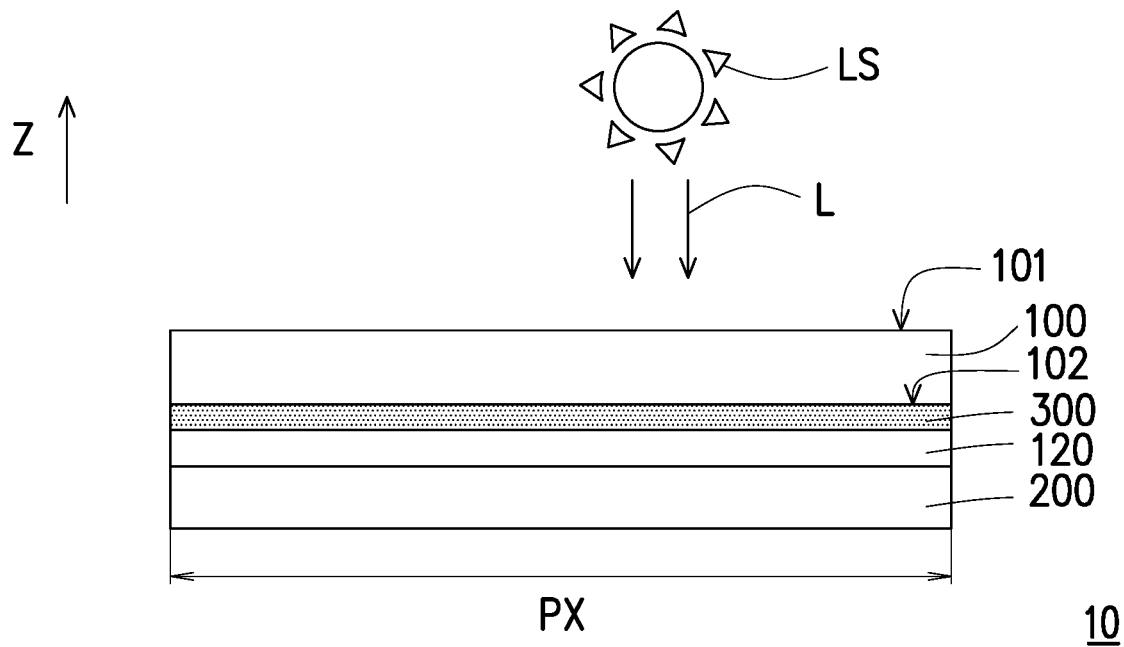
FIG. 1 is a schematic cross-sectional view of an example provided by the disclosure.

The disclosure may be understood by referring to the following detailed description in collaboration with the accompanying drawings. It should be noted that, in order to make it easy for readers to understand and to simplify the drawings, only a part of an electronic device is drawn in the drawings of the disclosure, and the specific elements in the drawings are not drawn according to actual scales. In addition, the number and size of each element in the figure are only illustrative, and are not used to limit the scope of the disclosure.

Certain terms are used throughout the specification of the disclosure and the appended claims to refer to specific components. Those skilled in the art should understand that electronic device manufacturers may probably use different names to refer to the same components. This specification is not intended to distinguish between components that have the same function but different names. In the following specification and claims, the terms "containing", "including", "having", etc., are open terms, so that they should be interpreted as meaning of "including but not limited to . . . ". Therefore, when the terms "including", "containing", and/or "having" are used in the description of the disclosure, they specify existence of corresponding features, regions, steps, operations, and/or components, but do not exclude existence of one or more corresponding features, regions, steps, operations, and/or components.

Directional terminology mentioned in the specification, such as "top", "bottom", "front", "back", "left", "right", etc., is used with reference to the orientation of the figures being described. Therefore, the used directional terminology is only illustrative, and is not intended to be limiting of the disclosure. In the figures, the drawings illustrate general characteristics of methods, structures, and/or materials used in specific embodiments. However, these drawings should not be construed as defining or limiting of a scope or nature covered by these embodiments. For example, for clarity's sake, a relative size, a thickness and a location of each film layer, area and/or structure may be reduced or enlarged.

It should be understood that when a component or film layer is referred to as being "connected to" another component or film layer, it may be directly connected to the another component or film layer, or there may be an intervening component or film layer there between. When a component is referred to as being "directly connected to" another component or film layer, there is no intervening component or film layer there between. In addition, when a component is referred to as being "coupled to another component (or a variant thereof)", the component may be directly connected to the another component, or indirectly connected (for example, electrically connected) to the another component through one or more components.

In the disclosure, length and width may be measured by using an optical microscope, and thickness may be obtained by measuring a cross-sectional image in an electron microscope, but the disclosure is not limited thereto. Moreover, there may be a certain error in any two values or directions used for comparison.

The terms "about", "substantially" or "approximately" mentioned herein generally represent falling within 20% of a given value or range, or represent falling within 10%, 5%, 3%, 2%, 1% or 0.5% of the given value or range.

In the disclosure, when one structure (or layer, component, substrate) is described to be located on another structure (or layer, component, substrate), it means that the two structures are adjacent and directly connected (or contacted), or means that the two structures are adjacent but not directly connected (or contacted). Indirect connection means that there is at least one intermediate structure (or intermediate layer, intermediate component, intermediate substrate, intermediate space) between the two structures, and a lower surface of one structure is adjacent or directly connected to an upper surface of the intermediate structure, and an upper surface of the other structure is adjacent or directly connected (or contacted) to a lower surface of the intermediate structure, and the intermediate structure may be composed of a single layer or multi-layer solid structure or non-solid structure, which is not limited by the disclosure. In the disclosure, when a certain structure is disposed "on" another structure, it probably means that the certain structure is "directly" on the another structure, or means that the certain structure is "indirectly" on the another structure, i.e., at least one structure is sandwiched between the certain structure and the another structure.

"First", "second" . . . etc. in the specification of the disclosure may be used herein to describe various elements, components, regions, layers and/or parts, but these elements, components, regions, and/or parts should not be limited by these terms. These terms are only used to distinguish one element, component, region, layer or part from another element, component, region, layer or part. Therefore, the first "element", "component", "region", "layer", or "part" discussed below is used to distinguish with the second "element", "component", "region", "layer", or "part", and is not used to limit a sequence or a specific element, component, region, layer and/or part.

An electronic device or a window may achieve a display effect through a transparent display device of an embodiment of the disclosure. The electronic device may include a display device, an antenna device, a sensing device, a splicing device or a transparent display device, but the disclosure is not limited thereto. The electronic device may be a rollable, stretchable, bendable or flexible electronic device. The electronic device may include, for example, liquid crystal, light-emitting diodes (LEDs), quantum dots (QDs), fluorescence, phosphor, or other suitable materials and the materials may be arbitrarily arranged and combined or other suitable display media, or combinations thereof; the LEDs may include, for example, organic light-emitting diodes (OLEDs), mini LEDs, micro LEDs or quantum dot (QD) LEDs (for example, QLEDs, or QDLEDs), but the disclosure is not limited thereto. The antenna device may be, for example, a liquid crystal antenna, but the disclosure is not limited thereto. The splicing device may be, for example, a display splicing device or an antenna splicing device, but the disclosure is not limited thereto. It should be noted that the electronic device may be any arrangement and combination of the foregoing, but the disclosure is not limited thereto. In addition, an appearance of the electronic device may be a rectangle, a circle, a polygon, a shape with curved edges, or other suitable shapes. The electronic device may have peripheral systems such as a driving system, a control system, a light source system, a rack system, etc., to support the display device, the antenna device or the splicing device. Hereinafter, a window or a transparent display device is used to describe the content of the disclosure, but the disclosure is not limited thereto.

In the disclosure, the various embodiments described below may be mixed and matched without departing from the spirit and scope of the disclosure. For example, some features of one embodiment may be combined with some features of another embodiment to form another embodiment.

Reference is now be made in detail to the exemplary embodiments of the disclosure, and examples of the exemplary embodiments are illustrated in the accompanying drawings. Whenever possible, the same component symbols are used in the drawings and descriptions to indicate the same or similar parts.

Figure 2:
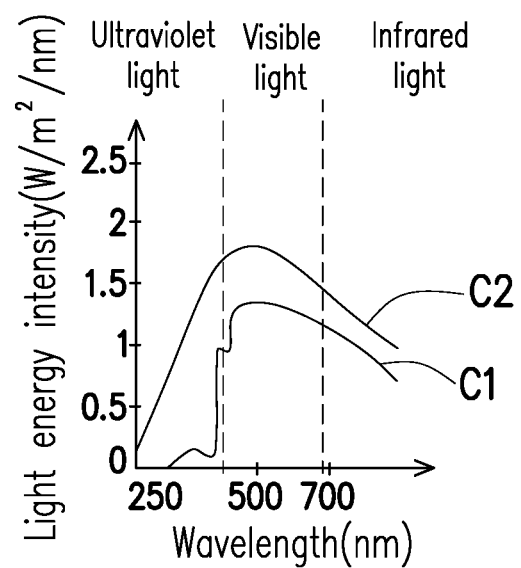
FIG. 2 is a schematic diagram of radiation intensity of a blocked waveband of an ultraviolet light shielding layer according to an embodiment of the disclosure.

FIG. 1 is a schematic cross-sectional view of an example provided by the disclosure, and the example may be, for instance, a window. For clarity of the drawing and convenience of descriptions, several elements are omitted in FIG. 1. FIG. 2 is a schematic diagram of radiation intensity of a blocked waveband of an ultraviolet light shielding layer according to an embodiment of the disclosure. Referring to FIG. 1, the window of the disclosure may include an electronic window with a display function or a transparent display device, but the disclosure is not limited thereto. In an embodiment of the disclosure, a window 10 includes a transparent display panel 200, a transparent substrate 100, and an ultraviolet light shielding layer 300. The transparent substrate 100 is disposed on the transparent display panel 200. The ultraviolet light shielding layer 300 is disposed on the transparent display panel 200. The example of the disclosure is the window 10, which may be applied to a display cabinet or a car window, but the disclosure is not limited thereto. For example, in the above embodiment, the glass of the window is, for example, disposed on a transparent display panel first, and then the glass of the window is installed in an outer frame of the window or a door frame of a vehicle body, but the disclosure is not limited thereto. In other embodiments, the glass of the window is first installed in the outer frame of the window or the door frame of the vehicle body, and then the transparent display panel is installed on the glass of the window, but the disclosure is not limited thereto. The aforementioned embodiments are provided for illustrative purposes only, and the disclosure is not intended to limit a manufacturing order or method of the window 10. Those skilled in the art should understand that none of arranging the transparent display panel on the transparent substrate or arranging the transparent substrate on the transparent display panel deviates from the spirit of the disclosure. Under the above arrangement, the ultraviolet light shielding layer 300 may shield light with a specific wavelength in the ambient light, so as to reduce an amount of radiation of the light with the specific wavelength that enters the transparent display panel 200. In this way, components in the transparent display panel 200 may be protected to reduce the risk of deterioration caused by irradiation of the light with the specific wavelength. Therefore, the window 10 or the transparent display panel 200 may exhibit good structural reliability or display quality.

Referring to FIG. 1, the window 10 includes a transparent substrate 100. The transparent substrate 100 includes a rigid substrate, a flexible substrate, or a combination thereof. For example, the transparent substrate 100 includes glass, quartz, sapphire, acrylic resin, polycarbonate (PC), polyimide (PI), polyethylene terephthalate (PET), other suitable transparent materials, or a combination thereof, but the disclosure is not limited thereto. According to an embodiment of the disclosure, the transparent substrate 100 is, for example, glass used as a window. In some other embodiments, the transparent substrate 100 is, for example, glass used as a vehicle window, but the disclosure is not limited thereto.

The transparent substrate 100 includes two opposite sides. In a Z-axis direction (i.e., a normal direction of the transparent substrate 100), a second side 102 may be the side of the transparent substrate 100 away from an ambient light source LS. Namely, the second side 102 may face away from the ambient light source LS. In addition, a first side 101 may be the other side of the transparent substrate 100 relative to the second side 102. Namely, the first side 101 may be the side of the transparent substrate 100 facing the ambient light source LS. In some embodiments, the ambient light source LS is, for example, sunlight, lamplight, or other possible light sources, but the disclosure is not limited thereto. The ambient light source LS may provide incident light L. The incident light L may include visible light, ultraviolet light, infrared light, or electromagnetic radiation of other wavelengths, but the disclosure is not limited thereto. The incident light L may be incident to the transparent substrate 100 from the first side 101 of the transparent substrate 100 along the Z-axis. In other embodiments, the incident light L may be emitted out from the second side 102 of the transparent substrate 100 along the Z-axis, but the disclosure is not limited thereto. The incident light L may be directional light or non-directional light. It should be noted that the incident light L shown in FIG. 1 is, for example, incident to the transparent substrate 100 at an angle perpendicular to the first side 101 (i.e., an angle between the incident light L and the first side 101 is 90°) along the Z-axis, but the disclosure is not limited thereto. In other embodiments, the incident light L may be incident to the transparent substrate 100 substantially along the Z-axis. For example, the angle between the incident light L and the first side 101 may be between 0° and 90°.

The window 10 further includes the transparent display panel 200. The transparent display panel 200 is, for example, a liquid crystal display panel, a micro LED display panel, a mini LED display panel, an OLED display panel, or a QDLED display panel, but the disclosure is not limited thereto. In some embodiments, the transparent display panel 200 is, for example, a display panel including a thin film transistor array (TFT array) substrate and LED elements, but the disclosure is not limited thereto. In some embodiments, the transparent display panel 200 has at least one active region PX, which is used as a display panel for displaying image frames. In the embodiment of the disclosure, the active region PX may be defined as a plurality of pixels with an image display function, or a display area containing the plurality of pixels with the image display function. In the embodiment, the active region PX is, for example, a display area with a display function. The transparent display panel 200 is briefly described in FIG. 7B in subsequent paragraphs.

In some embodiments, the transparent substrate 100 is disposed on the transparent display panel 200. To be specific, the second side 102 of the transparent substrate 100 is disposed on the transparent display panel. In other embodiments, an adhesive layer 120 may be selectively disposed between the second side 102 of the transparent substrate 100 and the transparent display panel 200. The adhesive layer 120 may include a material with adhesion. For example, the adhesive layer 120 may include an optical clear adhesive (OCA), an optical clear resin (OCR), a pressure sensitive adhesive (PSA), other suitable materials, a combination thereof, or other suitable adhesives or epoxy resins, but the disclosure is not limited thereto.

The window 10 further includes the ultraviolet light shielding layer 300. The ultraviolet light shielding layer 300 is disposed on the transparent display panel 200. In some embodiments, the ultraviolet light shielding layer 300 is located between the second side 102 of the transparent substrate 100 and the transparent display panel 200. In some other embodiments, the ultraviolet light shielding layer 300 is located between the second side 102 of the transparent substrate 100 and the adhesive layer 120, but the disclosure is not limited thereto. On the Z-axis, the ultraviolet light shielding layer 300 is completely overlapped with the active region PX of the transparent display panel 200. Under the above arrangement, the ultraviolet light shielding layer 300 may be located between the transparent substrate 100 and the transparent display panel 200.

The ultraviolet light shielding layer 300 may be formed by a material capable of reflecting or absorbing light of an ultraviolet light waveband. In other words, the ultraviolet light shielding layer 300 is a sheet-like or film-like structure made of a material that may shield the light of the ultraviolet light waveband. In some embodiments, the ultraviolet light shielding layer 300 may block light with a wavelength greater than or equal to 200 nanometers (nm) and less than or equal to 400 nm, or light with a wavelength greater than or equal to 300 nm and less than or equal to 400 nm.

Referring to FIG. 2, FIG. 2 is a diagram illustrating a relationship between light wavelengths and light energy intensities. FIG. 2 illustrates a light energy intensity curve C1 of the incident light L after passing through the ultraviolet light shielding layer 300 and a light energy intensity curve C2 of the incident light L not passing through the ultraviolet light shielding layer 300. In detail, ultraviolet light may be divided into several wavebands, for example, ultraviolet light A (UVA), ultraviolet light B (UVB) and ultraviolet light C (UVC). The waveband of UVA is 315 nm to 400 nm. The waveband of UVB is 280 nm to 315 nm. The waveband of UVC is 190 nm to 280 nm. In the aforementioned waveband shown in FIG. 2 (for example, 200 nm to 400 nm), the light energy intensity curve C2 of the incident light L not passing through the ultraviolet light shielding layer 300 may be about 1.5 W/m$^2$/nm at a wavelength of 400 nm. The light energy intensity curve C1 of the incident light L after passing through the ultraviolet light shielding layer 300 may be about 0.1 W/m$^2$/nm at the wavelength of 400 nm. Namely, the light energy intensity curve C1 may be approximately 10% (for example, 6%) of the light energy intensity curve C2. In other words, after the incident light L passes through the ultraviolet light shielding layer 300, energy integration thereof at the ultraviolet light waveband (for example, 200 nm to 280 nm, 280 nm to 315 nm, or 315 nm to 400 nm) may be reduced by 90% or more. In other embodiments, after the incident light L passes through the ultraviolet light shielding layer 300, the energy integration at the ultraviolet light waveband may be reduced by 30%, 50%, or 70% or more, but the disclosure is not limited thereto. In this way, the ultraviolet light shielding layer 300 of the embodiment of the disclosure may be used to block the ultraviolet light with the wavelength greater than or equal to 300 nm and less than or equal to 400 nm.

In some embodiments, a Young's modulus of the ultraviolet light shielding layer 300 may be greater than or equal to a Young's modulus of the transparent display panel 200. Alternatively, a rigidity of the ultraviolet light shielding layer 300 may be greater than or equal to a rigidity of the transparent display panel 200. In some other embodiments, a thickness of the ultraviolet light shielding layer 300 may be greater than or equal to a thickness of the transparent display panel 200. The thickness of the ultraviolet light shielding layer 300 may be defined as the maximum thickness of the ultraviolet light shielding layer 300 on the Z-axis. The thickness of the transparent display panel 200 may be defined as the maximum thickness of the transparent display panel 200 on the Z-axis. Under the above arrangement, the ultraviolet light shielding layer 300 may be configured to support the transparent display panel 200. In this way, the structural reliability of the transparent display panel 200 may be improved. The overall structural reliability of the window 10 may be improved.

It should be noted that on the Z-axis, the ultraviolet light shielding layer 300 is completely overlapped with the active region PX of the transparent display panel 200, and the ultraviolet light shielding layer 300 is located between the transparent substrate 100 and the transparent display panel 200. Under the above arrangement, the ultraviolet light shielding layer 300 may be completely located between the ambient light source LS and the transparent display panel 200. In this way, the incident light L emitted from the ambient light source LS may enter the transparent substrate 100 from the first side 101, and then enter and penetrate through the ultraviolet light shielding layer 300 from the second side 102. An ultraviolet light wavelength (for example, a wavelength between 300 nm and 400 nm) of the incident light L passing through the ultraviolet light shielding layer 300 is blocked by the ultraviolet light shielding layer 300. Therefore, the ultraviolet light in the incident light L irradiated to the transparent display panel 200 and the active region PX thereof may be reduced. In this way, deterioration of the transparent display panel 200 and the electronic components in the active region PX thereof, such as active components, light-emitting components, or other circuit components caused by irradiation of ultraviolet light may be reduced. Therefore, the structural quality or display quality of the transparent display panel 200 may be improved. In addition, the window 10 may exhibit good structural quality or display quality.

Other embodiments are provided below for further description. It should be noticed that reference numbers of the components and a part of contents of the aforementioned embodiment are also used in the following embodiment, wherein the same reference numbers denote the same or like components, and descriptions of the same technical contents are omitted. In addition, the same or similar components may be denoted by similar reference numerals, and details thereof are not repeated. The aforementioned embodiments may be referred for descriptions of the omitted parts, and detailed descriptions thereof are not repeated in the following embodiments.

Figure 3:
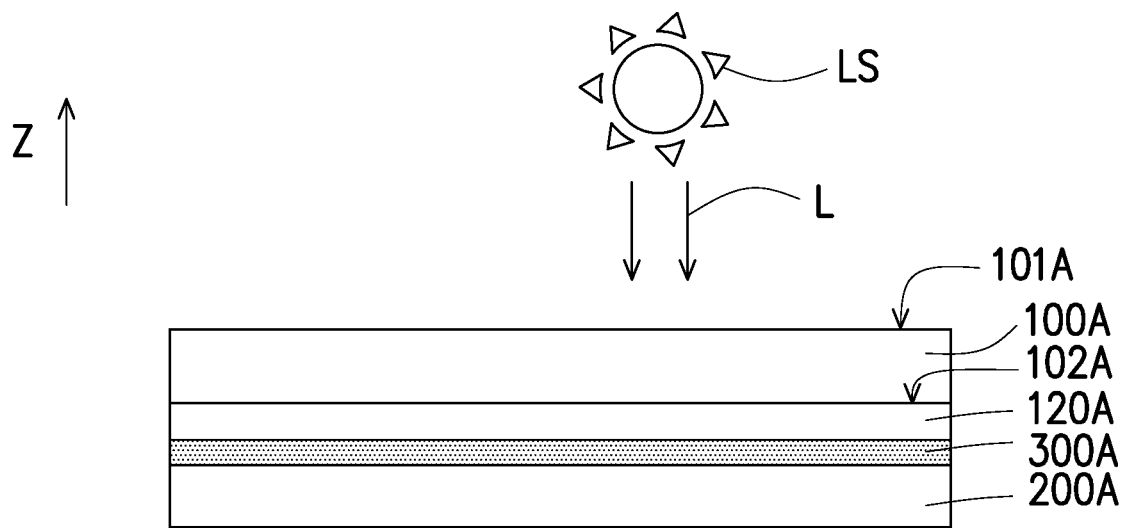
FIG. 3 is a schematic cross-sectional view of a window according to another embodiment of the disclosure.

FIG. 3 is a schematic cross-sectional view of a window according to another embodiment of the disclosure. For clarity of the drawing and convenience of descriptions, several elements are omitted in FIG. 3. A window 10A of the embodiment is substantially similar to the window 10 of FIG. 1, so that the same and similar components in the two embodiments are not repeated. A main difference therebetween is that an ultraviolet light shielding layer 300A may be disposed on one side of a transparent display panel 200A. In some embodiments, the transparent display panel 200A and the ultraviolet light shielding layer 300 disposed thereon may form a transparent display device, but the disclosure is not limited thereto. In detail, the ultraviolet light shielding layer 300A may be disposed on the transparent display device 200A. The transparent display device 200A and the ultraviolet light shielding layer 300A may be disposed on a second side 102A of a transparent substrate 100A. In some embodiments, an adhesive layer 120A may also be selectively disposed on the second side 102A to fix the ultraviolet light shielding layer 300A to the second side 102A, but the disclosure is not limited thereto.

In some embodiments, the ultraviolet light shielding layer 300A is located between the second side 102A of the transparent substrate 100A and the transparent display panel 200A, and the adhesive layer 120A is located between the second side 102A and the ultraviolet light shielding layer 300A. In this way, the incident light L emitted by the ambient light source L facing the first side 101A may pass through the ultraviolet light shielding layer 300A after entering the transparent substrate 100A. The incident light L passing through the ultraviolet light shielding layer 300A may irradiate the transparent display panel 200A. In this way, deterioration of the transparent display panel 200A and the electronic components in the active region PX thereof (shown in FIG. 1) caused by irradiation of ultraviolet light may be reduced. The window 10A may exhibit good display quality. In addition, the ultraviolet light shielding layer 300A fixed to the transparent display panel 200A may be configured to support the transparent display panel 200A. The window may also achieve excellent technical effects similar to that of the aforementioned embodiment, and structural reliability or display quality is thereby improved.

Figure 4:
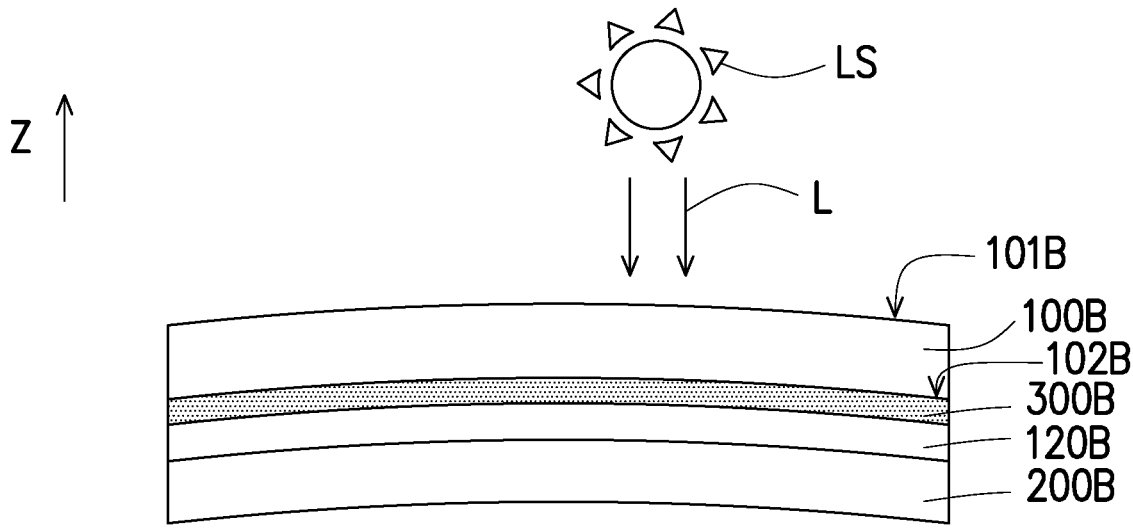
FIG. 4 is a schematic cross-sectional view of a window according to another embodiment of the disclosure.

FIG. 4 is a schematic cross-sectional view of a window according to another embodiment of the disclosure. For clarity of the drawing and convenience of descriptions, several elements are omitted in FIG. 4. A window 10B of the embodiment is substantially similar to the window 10A of FIG. 3, so that the same and similar components in the two embodiments are not repeated. A main difference between the embodiment and the window 10A is that a transparent substrate 100B may be a substrate having a curved surface. The transparent substrate 100B, for example, includes a first side 101B facing the ambient light source LS and a second side 102B opposite to the first side 101B. In some embodiments, since a transparent display panel 200B, an adhesive layer 120B, and an ultraviolet light shielding layer 300B may all include flexible materials, they may be attached to the second side 102B of the transparent substrate 100B. In the embodiment, the ultraviolet light shielding layer 300B may be disposed between the second side 102B of the transparent substrate 100B and the transparent display panel 200B. The adhesive layer 120B may be disposed between the ultraviolet light shielding layer 300B and the transparent display panel 200B, but the disclosure is not limited thereto. In this way, the window 10B may be curved. Under the above arrangement, the window 10B may achieve similar effects as that of the aforementioned embodiments, and structural reliability or display quality is thereby improved.

Figure 5:
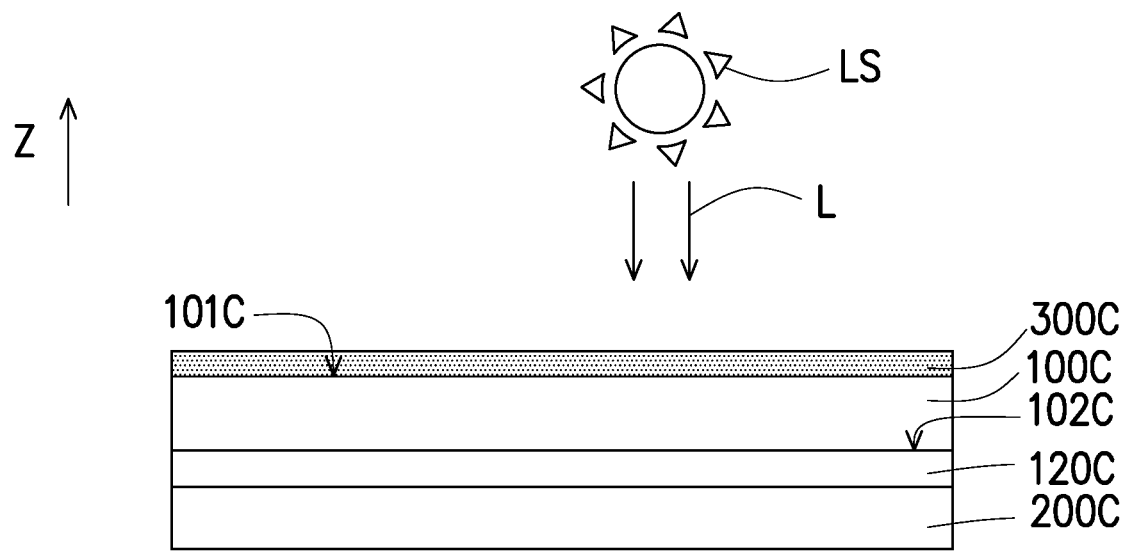
FIG. 5 is a schematic cross-sectional view of a window according to another embodiment of the disclosure.

FIG. 5 is a schematic cross-sectional view of a window according to another embodiment of the disclosure. For clarity of the drawing and convenience of descriptions, several elements are omitted in FIG. 5. A window 10C of the embodiment is substantially similar to the window 10 of FIG. 1, so that the same and similar components in the two embodiments are not repeated. A main difference between the embodiment and the window 10 is that a transparent display panel 200C may be disposed on one side of a transparent substrate 100C and an ultraviolet light shielding layer 300C may be disposed on the other side of the transparent substrate 100C opposite to the above one side. For example, the transparent substrate 100C has a second side 102C away from the ambient light source LS and a first side 101C opposite to the second side 102C. The first side 101C faces the ambient light source LS. The transparent display panel 200C is disposed on the second side 102C, and the ultraviolet light shielding layer 300C is disposed on the first side 101C.

In some embodiments, an adhesive layer 120C may be selectively disposed on the second side 102C. The adhesive layer 120C is disposed between the transparent substrate 100C and the transparent display panel 200C.

Under the above arrangement, the ultraviolet light shielding layer 300C is located between the ambient light source LS and the transparent display panel 200C. In this way, deterioration of the transparent display panel 200C and the electronic components therein caused by irradiation of ultraviolet light may be reduced. The window 10C may also achieve excellent technical effects similar to that of the aforementioned embodiments, and structural reliability or display quality is thereby improved.

Figure 6:
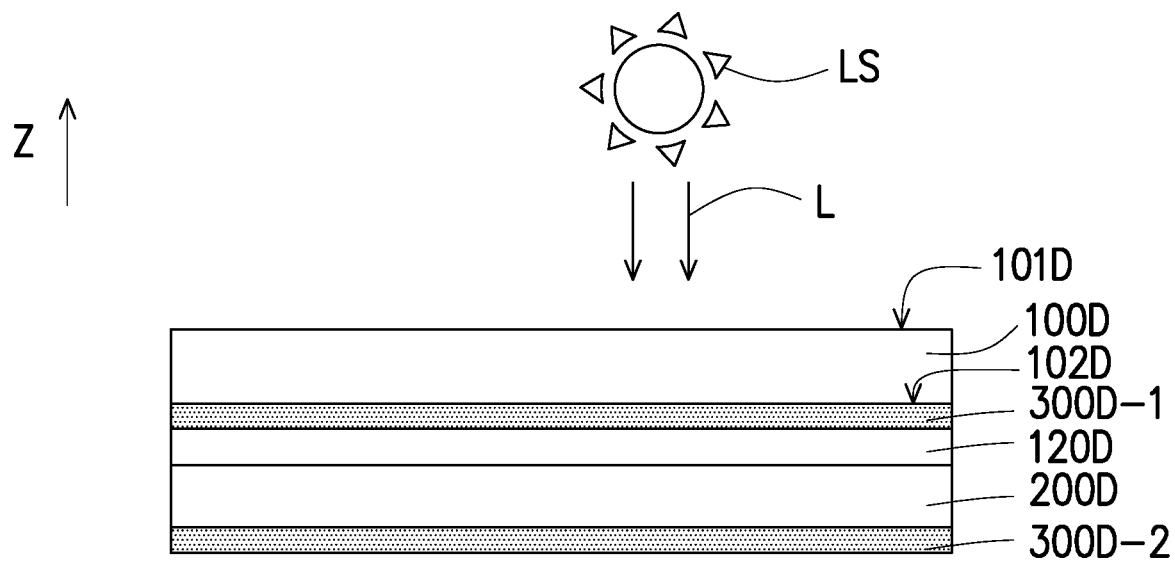
FIG. 6 is a schematic cross-sectional view of a window according to another embodiment of the disclosure.

FIG. 6 is a schematic cross-sectional view of a window according to another embodiment of the disclosure. For clarity of the drawing and convenience of descriptions, several elements are omitted in FIG. 6. A window 10D of the embodiment is substantially similar to the window 10 of FIG. 1, so that the same and similar components in the two embodiments are not repeated. A main difference between the embodiment and the window 10 is that the window 10D further includes two ultraviolet light shielding layers 300D-1 and 300D-2, and a transparent display panel 200D is disposed between the ultraviolet light shielding layer 300D-1 and the ultraviolet light shielding layer 300D-2. For example, the two ultraviolet light shielding layers include a first ultraviolet light shielding layer 300D-1 and a second ultraviolet light shielding layer 300D-2. The transparent substrate 100D includes a first side 101D and a second side 102D opposite to each other. The first ultraviolet light shielding layer 300D-1 is disposed between the second side 102D of the transparent substrate 100D and the transparent display panel 200D. The second ultraviolet light shielding layer 300D-2 is disposed on one side of the transparent display panel 200D away from the transparent substrate 100D. In other words, the first ultraviolet light shielding layer 300D-1 and the second ultraviolet light shielding layer 300D-2 are located on opposite sides of the transparent display panel 200D.

In some embodiments, an adhesive layer 120D may be selectively disposed between the first ultraviolet light shielding layer 300D-1 and the transparent display panel 200D, but the disclosure is not limited thereto.

Under the above arrangement, the transparent display panel 200D is disposed between the first ultraviolet light shielding layer 300D-1 and the second ultraviolet light shielding layer 300D-2. In this way, deterioration of the transparent display panel 200D and the electronic components therein caused by irradiation of ultraviolet light may be reduced. The window 10D may also achieve excellent technical effects similar to that of the aforementioned embodiments, and structural reliability or display quality is thereby improved.

Figure 7A:
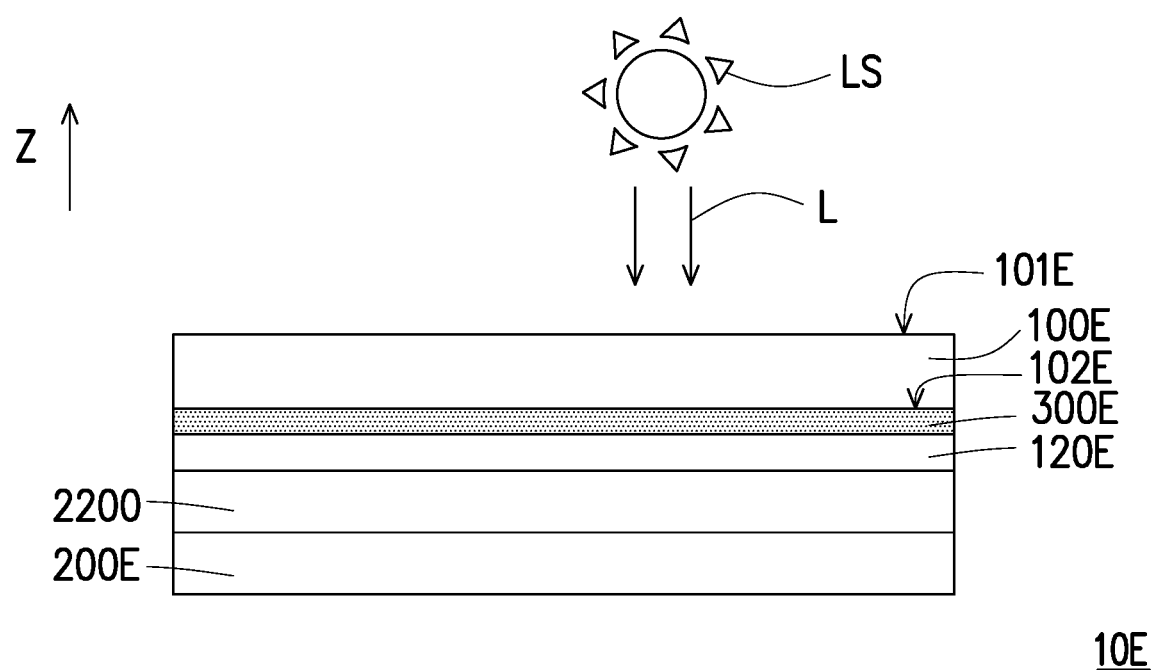
FIG. 7A is a schematic cross-sectional view of a window according to another embodiment of the disclosure.
Figure 7B:
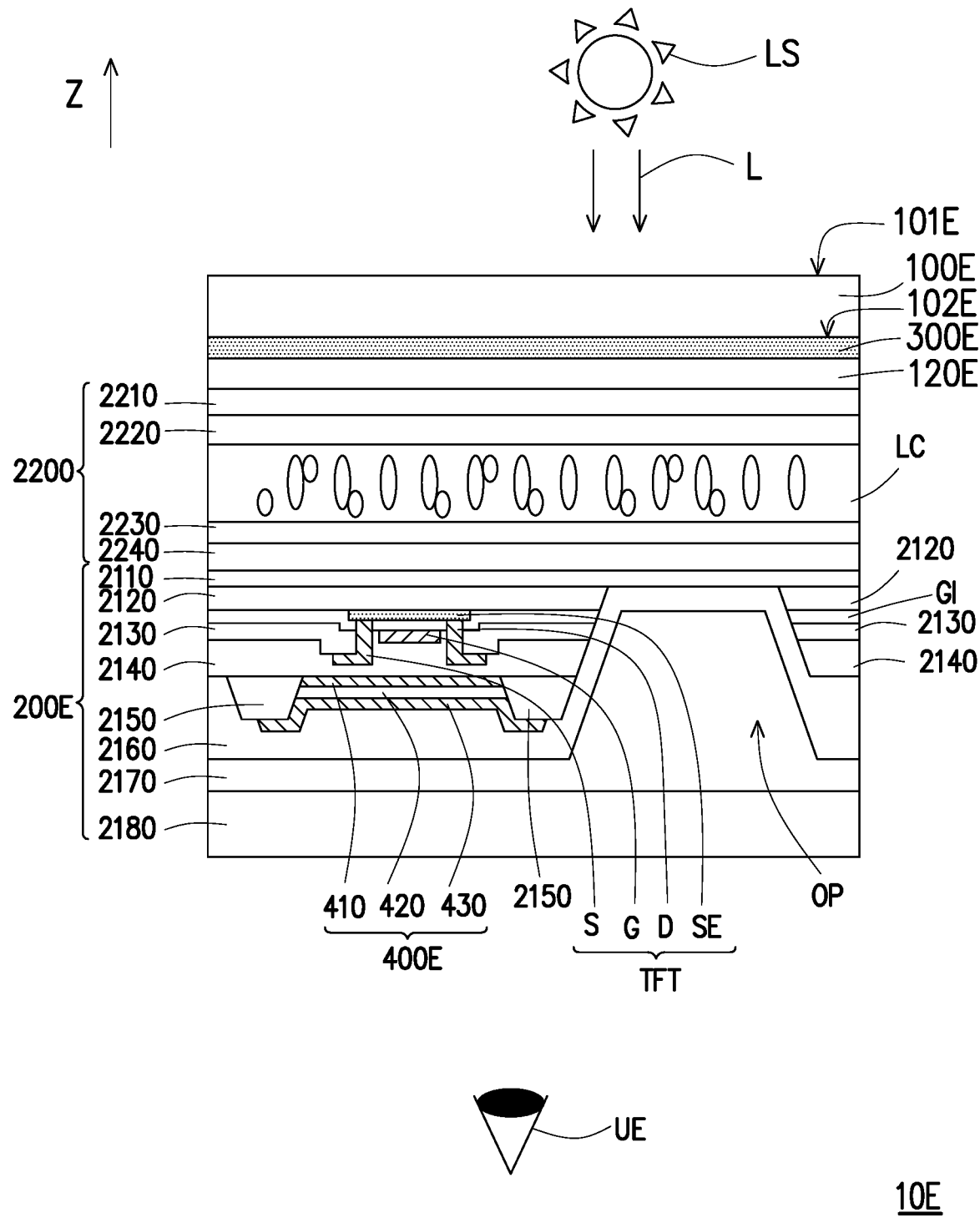
FIG. 7B is a schematic cross-sectional view of a transparent display panel and a transparency adjustable panel of FIG. 7A.

FIG. 7A is a schematic cross-sectional view of a window according to another embodiment of the disclosure. FIG. 7B is a schematic cross-sectional view of a transparent display panel and a transparency adjustable panel of FIG. 7A. For clarity of the drawing and convenience of descriptions, several elements are omitted in FIG. 7A and FIG. 7B. A window 10E of the embodiment is substantially similar to the window 10 of FIG. 1, so that the same and similar components in the two embodiments are not repeated. A main difference between the embodiment and the window 10 is that the window 10E further includes a transparency adjustable panel 2200. The transparency adjustable panel 2200 is disposed between an ultraviolet light shielding layer 300E and a transparent display panel 200E.

In some embodiments, a transparent substrate 100E includes a first side 101E and a second side 102E opposite to each other. The first side 101E faces the ambient light source LS. The ultraviolet light shielding layer 300E is disposed on the second side 102E. The transparent display panel 200E and the transparency adjustable panel 2200 are located on the second side 102E.

In detail, the transparent display panel 200E is, for example, a transparent display, which has a light penetration property and a display function. The transparent display panel 200E is, for example, a display having an active array substrate and a light-emitting element 400E. The structure of the transparent display panel 200E is briefly described below with reference to FIG. 7B.

The transparent display panel 200E includes a substrate 2110, a dielectric layer 2120, a gate insulating layer GI, a dielectric layer 2130, a dielectric layer 2140, an encapsulation layer 2160, a filling layer 2160, and a passivation layer 2170 sequentially stacked on the Z-axis. The transparent display panel 200E further includes an active device TFT and a light-emitting element 400E. The substrate 2110 is, for example, a flexible support film, and a material thereof includes polyvinyl alcohol (PVA), polyvinyl chloride (PVC), polydimethylsiloxane (PDMS), polyethylene terephthalate (PET), poly (methyl methacrylate, PMMA), triacetate cellulose film (TAC) or other suitable materials, but the disclosure is not limited thereto. In some embodiments, a thickness of the substrate 2110 may be defined as the maximum thickness of the substrate 2110 in the Z-axis direction. The thickness of the substrate 2110 is, for example, 30 µm to 200 µm.

The dielectric layer 2120, the gate insulating layer GI, the dielectric layer 2130, and the dielectric layer 2140 may be a single-layer or multi-layer structure, and a material thereof is, for example, an insulating material, such as an organic material, an inorganic material, or a combination thereof. The organic material may include polyethylene naphthalate (PEN), polyethylene terephthalate (PET), polyethylene (PE), polyethersulfone (PES), polycarbonate (PC), polymethylmethacrylate (PMMA), polyimide (PI), photosensitive polyimide (PSPI) or a combination thereof, and the inorganic material may include silicon nitride, silicon oxide, silicon oxynitride, or a combination thereof, but the disclosure is not limited thereto. A thickness of the dielectric layer 2120, the gate insulating layer GI, the dielectric layer 2130, or the dielectric layer 2140 may be defined as: the maximum thickness of the dielectric layer 2120, the gate insulating layer GI, the dielectric layer 2130 or the dielectric layer 2140 in the Z-axis direction. The thickness of each of the dielectric layer 2120, the gate insulating layer GI, the dielectric layer 2130, or the dielectric layer 2140 is, for example, 5 µm to 30 µm, but the disclosure is not limited thereto. A thickness formed by stacking the dielectric layer 2120, the gate insulating layer GI, the dielectric layer 2130, and the dielectric layer 2140 is, for example, less than 100 µm, but the disclosure is not limited thereto.

The active device TFT is disposed in a transparent display unit 2100. For example, the active device TFT is disposed between the dielectric layer 2120 and the dielectric layer 2140. The active device TFT may be composed of a semiconductor layer SE, a gate G, a source S and a drain D. The semiconductor layer SE is disposed on the dielectric layer 2120. A material of the semiconductor layer SE is, for example, low temperature polysilicon (LTPS) or amorphous silicon, but the disclosure is not limited thereto.

The gate insulating layer GI is disposed on the semiconductor layer SE. The gate G is disposed on the gate insulating layer GI. A material of the gate G may include molybdenum (Mo), titanium (Ti), tantalum (Ta), niobium (Nb), hafnium (Hf), nickel (Ni), chromium (Cr), cobalt (Co), zirconium (Zr), tungsten (W), aluminum (Al), silver (Ag), aurum (Au) or others suitable metals, or alloys or combinations of the above materials, but the disclosure is not limited thereto.

The source S and the drain D are disposed on the dielectric layer 2130. The source S and the drain D may be electrically connected to the semiconductor layer SE through vias of the dielectric layer 2130. A material of the source S and the drain D may be similar to that of the gate G, so that detail thereof is not repeated.

The light-emitting element 400E is disposed on the dielectric layer 2140 or located between the dielectric layer 2140 and the encapsulation layer 2160. The light-emitting element 400E is, for example, an electroluminescent LED, but the disclosure is not limited thereto. The light-emitting element 400E may be an organic LED. The light-emitting element 400E may be defined by a barrier structure 2150 disposed on the dielectric layer 2140. For example, the light-emitting element 400E may include a first electrode 410, a second electrode 430, and a light-emitting layer 420 located between the first electrode 410 and the second electrode 430. The first electrode 410, the light-emitting layer 420, and the second electrode 430 may be located in the barrier structure 2150. At least a part of the second electrode 430 may cover the barrier structure 2150, but the disclosure is not limited thereto. The first electrode 410 may be electrically connected to the drain D, and a material thereof may be similar to that of the drain D, so that detail thereof is not repeated. A material of the second electrode 430 is, for example, a transparent conductive material, including indium-tin-oxide (ITO), but the disclosure is not limited thereto. The light-emitting layer 420 may be a multilayer structure, including a hole injection layer (HIL), a hole transfer layer (HTL), an emission layer (EL), and an electron transfer layer (ETL), but the disclosure is not limited thereto. The light-emitting layer 420 is, for example, a red organic light-emitting layer, a green organic light-emitting layer, a blue organic light-emitting layer, or a light-emitting layer of different colors generated by mixing light of various spectrums.

In other embodiments, the light-emitting element 400E may also be a micro LED, a mini LED, or other suitable light-emitting diodes. In some other embodiments, the transparent display panel 200E may be a transparent liquid crystal display, but the disclosure is not limited thereto.

In some embodiments, a user eye UE may be overlapped with the transparent display panel 200E on the Z-axis. In other words, the user eye UE may receive image light emitted by the light-emitting layer 420, so as to see an image pattern.

In some embodiments, the dielectric layer 2120, the gate insulating layer GI, the dielectric layer 2130, and the dielectric layer 2140 may be selectively provided with openings OP. The openings OP may be used to increase an aperture ratio of light penetration. In other words, the openings OP may help improving a light transmittance or transparency of the transparent display unit 2100. In some other embodiments, the openings OP may not be provided in the dielectric layer 2120, the gate insulating layer GI, the dielectric layer 2130, and the dielectric layer 2140. Under the above arrangement, the user eye UE may see the incident light L provided by the ambient light source LS. According to another aspect, the user may observe a scene on the first side 101 through the transparent display panel 200E and the transparent substrate 100E.

The encapsulation layer 2160 covers the barrier structure 2150, the light-emitting element 400E, and the dielectric layer 2140. In some embodiments, the encapsulation layer 2150 may be filled in the openings OP, but the disclosure is not limited thereto. A material of the encapsulation layer 2160 includes epoxy or other suitable materials, which is not limited by the disclosure.

In some embodiments, a filling layer 2170 may be selectively disposed on the encapsulation layer 2160. The filling layer 2170 may be filled into the opening OP, but the disclosure is not limited thereto. A material of the filling layer 2170 includes polyimide or other suitable materials, but the disclosure is not limited thereto.

The passivation layer 280 may be disposed on the encapsulation layer 2160 or the filling layer 2170. The passivation layer 280 is, for example, made of a transparent material, including PVA, PVC, PDMS, PET, PMMA, TAC or other suitable materials, but the disclosure is not limited thereto.

The window 10E further includes a transparency adjustable panel 2200. The transparency adjustable panel 2200 is, for example, a liquid crystal panel capable of adjusting a light transmittance, but the disclosure is not limited thereto. In some embodiments, the transparency adjustable panel 2200 may be an electrochromism dimming panel.

For example, the transparency adjustable panel 2200 includes a substrate 2210, a flexible substrate 2220, a flexible substrate 2230, and a substrate 2240 sequentially stacked on the Z-axis. The transparency adjustable panel 2200 further includes a liquid crystal layer LC disposed between the flexible substrate 2220 and the flexible substrate 2230. A material of the substrate 2210 and the substrate 2240, for example, includes PVA, PVC, PDMS, PET, PMMA, TAC, or other suitable materials, but the disclosure is not limited thereto. A thickness of the substrate 2210 and the substrate 2240 is, for example, 30 µm to 200 µm, but the disclosure is not limited thereto.

A material of the flexible substrate 2220 and the flexible substrate 2230 includes polyimide (PI), but the disclosure is not limited thereto. A thickness of the flexible substrate 2220 or the flexible substrate 2230 may be 5 µm to 30 µm. In other embodiments, the thickness of the flexible substrate 2220 or the flexible substrate 2230 may be less than 100 µm, but the disclosure is not limited thereto.

In some embodiments, at least the flexible substrate 2220 or the flexible substrate 2230 may be provided with conductive patterns or lines, but the disclosure is not limited thereto. An electric field may be generated between the conductive patterns or lines to drive liquid crystal molecules in the liquid crystal layer LC to rotate.

The liquid crystal layer LC includes a plurality of liquid crystal molecules. A material of the liquid crystal molecules includes dichroic dye liquid crystal (DDLC), polymer dispersed liquid crystal (PDLC), polymer network liquid crystal (PNLC), cholesteric liquid crystal (CLC), electrochromic (EC) or a suspended particle device (SPD), or other suitable materials, but the disclosure is not limited thereto.

Under the above arrangement, an electric field may be generated between the flexible substrate 2220 and the flexible substrate 2230 to rotate the plurality of liquid crystal molecules in the liquid crystal layer LC. Therefore, a degree of rotation of the liquid crystal molecules may be controlled by the electric field, so as to control a degree that the incident light L of the ambient light source LS penetrates through the transparency adjustable panel 2200. In this way, the incident light L may have different grayscale brightness after passing through the transparency adjustable panel 2200. Therefore, the transparency adjustable panel 2200 has a function of controlling brightness or transparency. Namely, when a brightness of the incident light L of the ambient light source LS is strong (for example, sunlight on a sunny day), the transparency adjustable panel 2200 may reduce the incident light L passing through the transparency adjustable panel 2200 by controlling the rotation degree of the liquid crystal molecules. In this way, a brightness of a displayed image or the brightness of the incident light L observed by the user eye UE may be reduced. Alternatively, when the brightness of the incident light L of the ambient light source LS is weak (for example, sunlight in a cloudy day), the transparency adjustable panel 2200 may increase the incident light L passing through the transparency adjustable panel 2200 by controlling the rotation degree of the liquid crystal molecules. In this way, the brightness of the displayed image or the brightness of the incident light L observed by the user eye UE may be improved. Therefore, the transparent display panel 200E may exhibit good display quality.

In some embodiments, the transparency adjustable panel 2200 is disposed between the transparent display panel 200E and the transparent substrate 100E. To be specific, the substrate 2110 may be adjacent to the substrate 2240. The ultraviolet light shielding layer 300E is located between the transparent substrate 100E and the substrate 2210. In some other embodiments, the adhesive layer 120E may be selectively disposed between the ultraviolet light shielding layer 300E and the substrate 2210. In this way, the transparent controllable panel 2200 is located between the ultraviolet light shielding layer 300E and the transparent display panel 200E, and has the function of controlling the brightness of the incident light L. The ultraviolet light shielding layer 300E is located between the ambient light source LS and the transparent display panel 200E. In this way, deterioration of the transparent display panel 200E and the active device TFT or the light-emitting element 400E therein caused by irradiation of ultraviolet light may be reduced. The window 10E may also achieve excellent technical effects similar to that of the aforementioned embodiments, and structural reliability or display quality is thereby improved.

Figure 8:
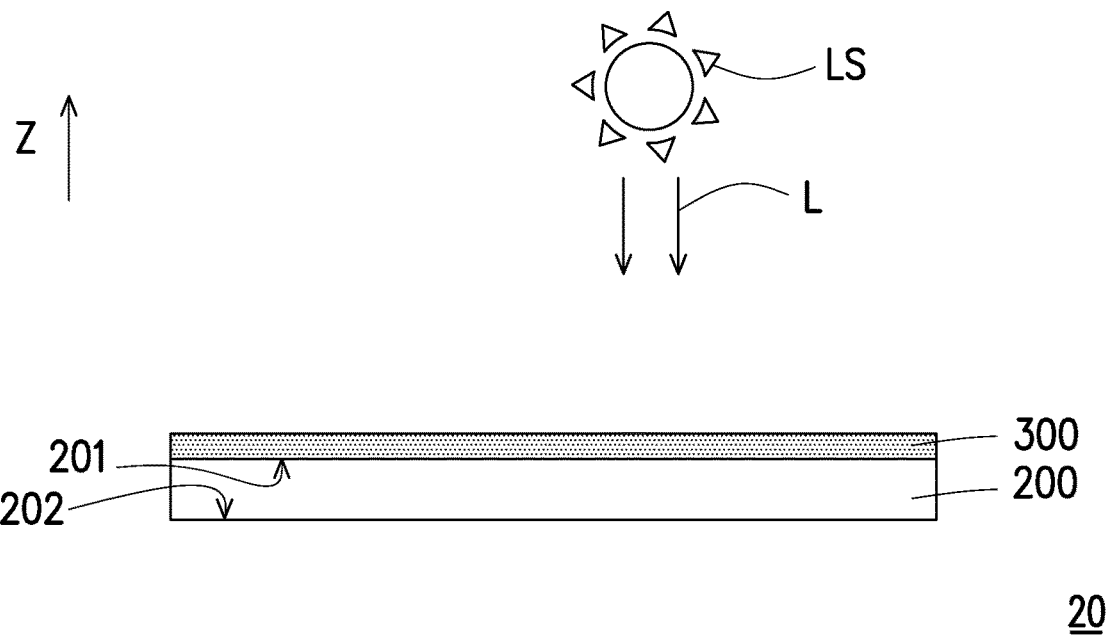
FIG. 8 is a schematic cross-sectional view of a transparent display device according to an embodiment of the disclosure.

FIG. 8 is a schematic cross-sectional view of a transparent display device according to an embodiment of the disclosure. For clarity of the drawing and convenience of descriptions, several elements are omitted in FIG. 8. The transparent display device 20 includes a transparent display panel 200 and an ultraviolet light shielding layer 300. The ultraviolet light shielding layer 300 is fixed on one side of the transparent display panel 200 (for example, the first side 201). In the embodiment, the transparent display panel 200 further has another side (for example, the second side 202) opposite to the one side. The first side 201 faces the ambient light source LS. The second side 202 is away from the ambient light source LS (for example, faces away from the ambient light source LS). The ultraviolet light shielding layer 300 is fixed on the first side 201 facing the ambient light source LS. Under the above arrangement, the ultraviolet light shielding layer 300 may be completely located between the ambient light source LS and the transparent display panel 200. In this way, deterioration of the transparent display panel 200 and the electronic components therein caused by irradiation of ultraviolet light may be reduced. The transparent display device 20 may exhibit good structural quality or display quality. In addition, the transparent display device 20 may also achieve excellent technical effects similar to that of the aforementioned embodiments.

Moreover, the Young's modulus of the ultraviolet light shielding layer 300 may be greater than or equal to the Young's modulus of the transparent display panel 200. Alternatively, the rigidity of the ultraviolet light shielding layer 300 may be greater than or equal to the rigidity of the transparent display panel 200. In some other embodiments, the thickness of the ultraviolet light shielding layer 300 may be greater than or equal to the thickness of the transparent display panel 200. Under the above arrangement, the ultraviolet light shielding layer 300 may be configured to support the transparent display panel 200. Therefore, the structural reliability of the transparent display panel 200 may be improved. The overall structural reliability of the transparent display device 20 may be improved.

Figure 9:
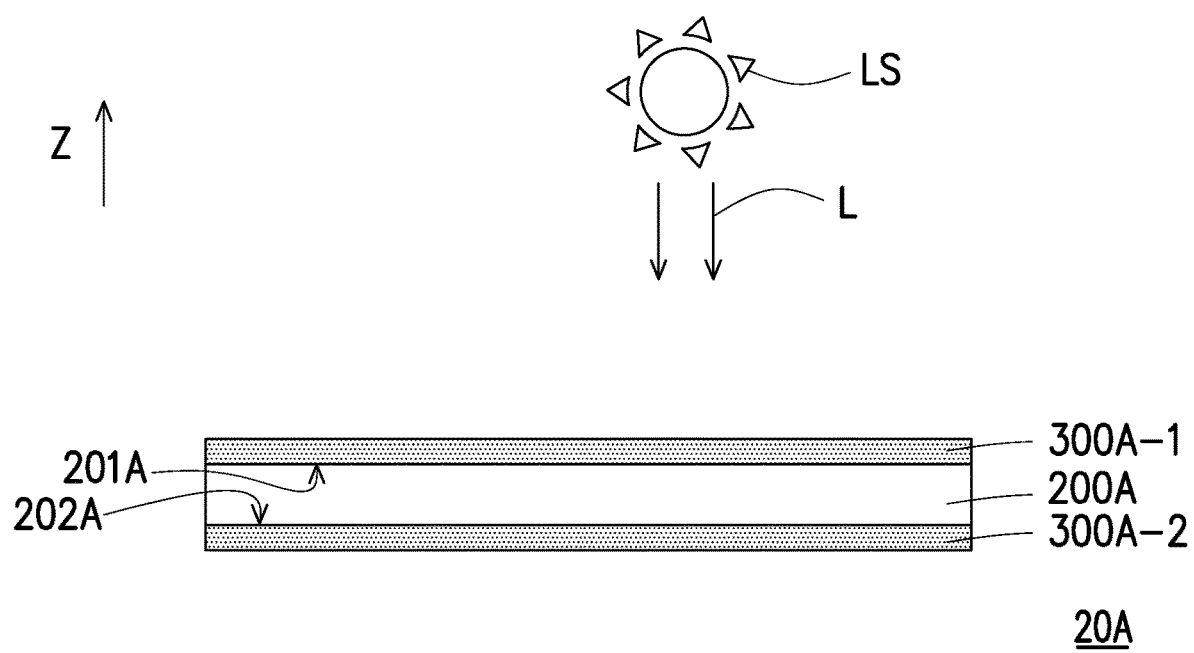
FIG. 9 is a schematic cross-sectional view of a transparent display device according to another embodiment of the disclosure.

FIG. 9 is a schematic cross-sectional view of a transparent display device according to another embodiment of the disclosure. For clarity of the drawing and convenience of descriptions, several elements are omitted in FIG. 9. A transparent display device 20A of the embodiment is substantially similar to the transparent display device 20 of FIG. 8, so that the same and similar components in the two embodiments are not repeated. A main difference between the embodiment and the transparent display device 20 is that the transparent display device 20A further includes two ultraviolet light shielding layers 300A-1, 300A-2, and the transparent display panel 200 is disposed between the ultraviolet light shielding layer 300A-1 and the ultraviolet light shielding layer 300A-2. For example, the two ultraviolet light shielding layers include a first ultraviolet light shielding layer 300A-1 and a second ultraviolet light shielding layer 300A-2. The first ultraviolet light shielding layer 300A-1 is disposed on the first side 201A of the transparent display panel 200A, and the second ultraviolet light shielding layer 300A-2 is disposed on the second side 202A opposite to the first side 201A. Under the above arrangement, the transparent display panel 200A is disposed between the first ultraviolet light shielding layer 300A-1 and the second ultraviolet light shielding layer 300A-2. In this way, deterioration of the transparent display panel 200A and the electronic components therein caused by irradiation of ultraviolet light may be reduced. In addition, the first ultraviolet light shielding layer 300A-1 and the second ultraviolet light shielding layer 300A-2 may also provide support for the transparent display panel 200A. Therefore, the structural reliability of the transparent display device 20A may be improved. The transparent display device 20A may also achieve excellent technical effects similar to that of the aforementioned embodiments, and structural reliability or display quality is thereby improved.

Figure 10:
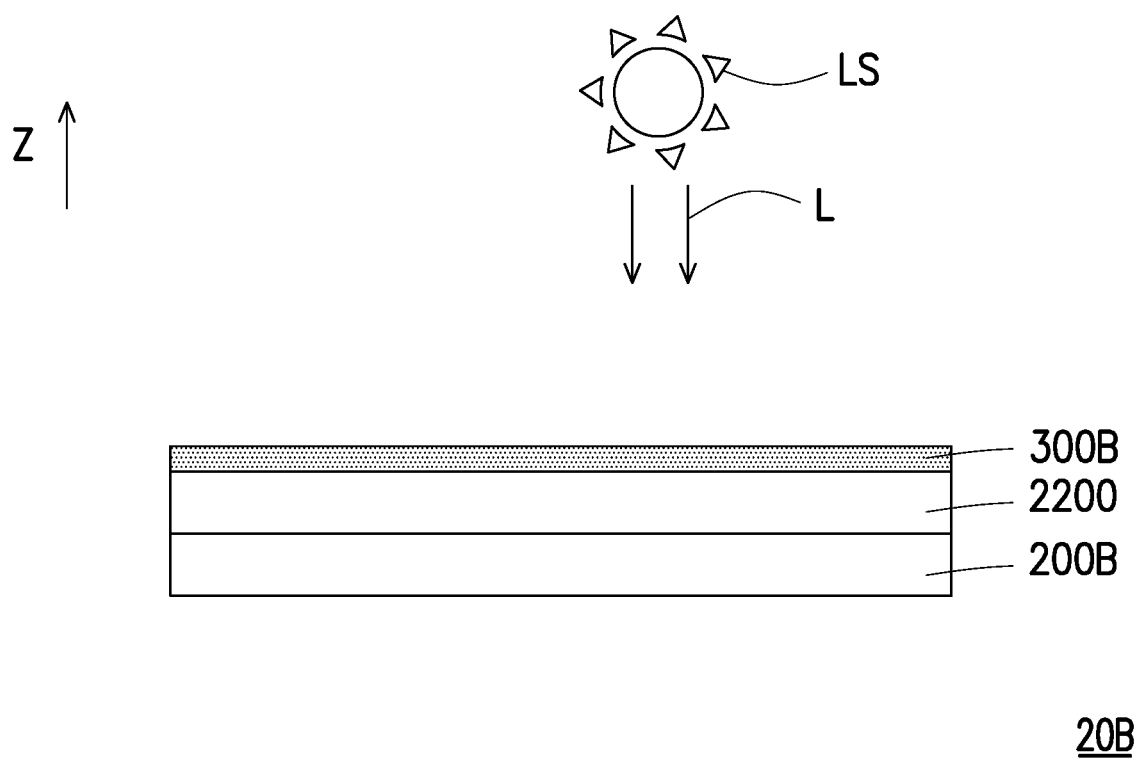
FIG. 10 is a schematic cross-sectional view of a transparent display device according to another embodiment of the disclosure.

FIG. 10 is a schematic cross-sectional view of a transparent display device according to another embodiment of the disclosure. For clarity of the drawing and convenience of descriptions, several elements are omitted in FIG. 10. A transparent display device 20B of the embodiment is substantially similar to the transparent display device 20 of FIG. 8, so that the same and similar components in the two embodiments are not repeated. A main difference between the embodiment and the transparent display device 20 is that the transparent display device 20B further includes the transparency adjustable panel 2200. Regarding the specific structure of the transparent controllable panel 2200, reference may be made to the descriptions of FIG. 7A and FIG. 7B, and details thereof are not repeated.

In some embodiments, the ultraviolet light shielding layer 300B is disposed on a first side 2201 of the transparency adjustable panel 2200 facing the ambient light source LS. Under the above arrangement, the ultraviolet light shielding layer 300B may be completely located between the ambient light source LS and the transparent display panel 200B. In this way, deterioration of the transparent display panel 200B and the electronic components therein caused by irradiation of ultraviolet light may be reduced. The transparent display device 20B may also achieve excellent technical effects similar to that of the aforementioned embodiments, and structural reliability or display quality is thereby improved.

Figure 11A:
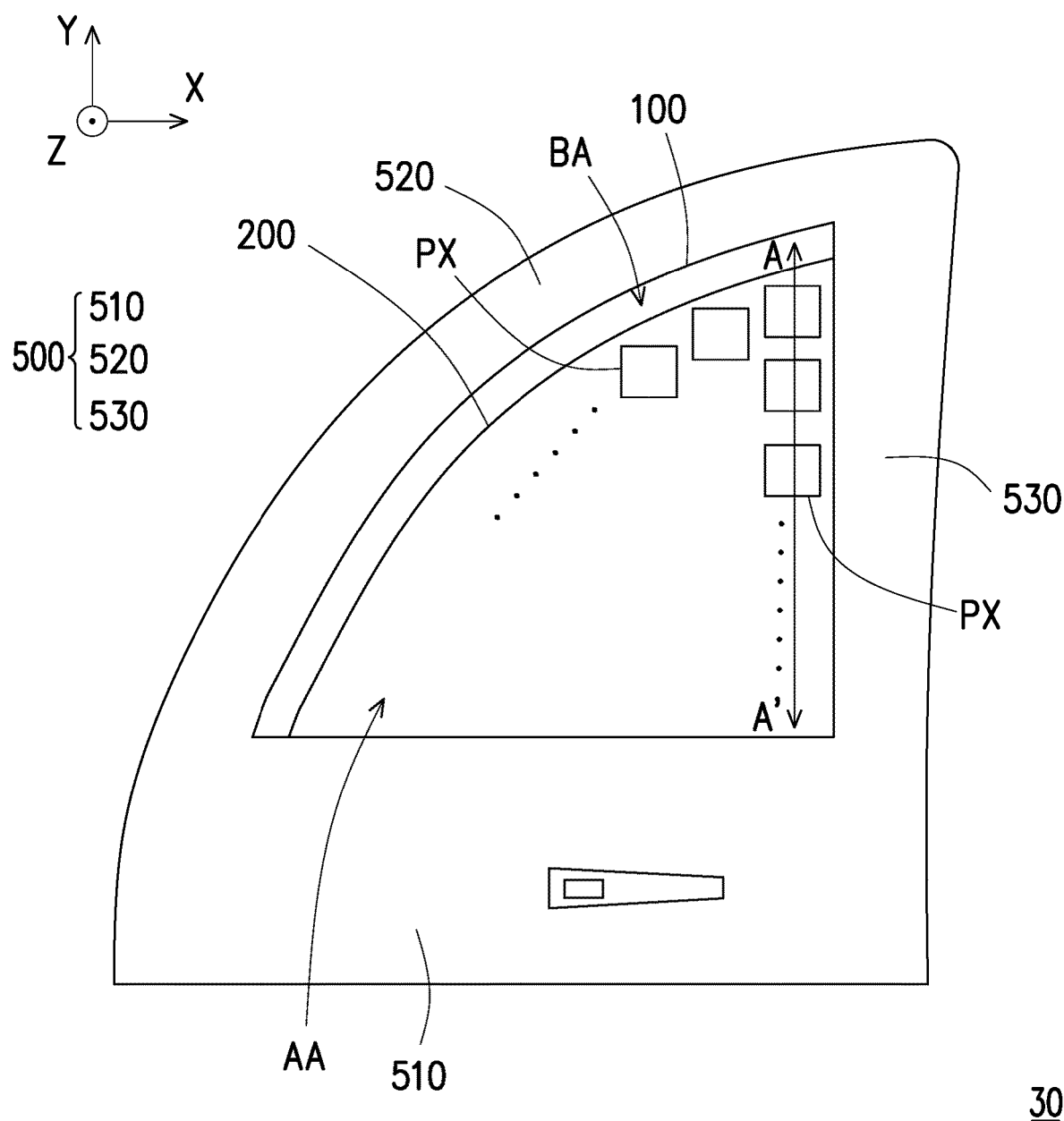
FIG. 11A is a schematic top view of a vehicle window according to an embodiment of the disclosure.
Figure 11B:
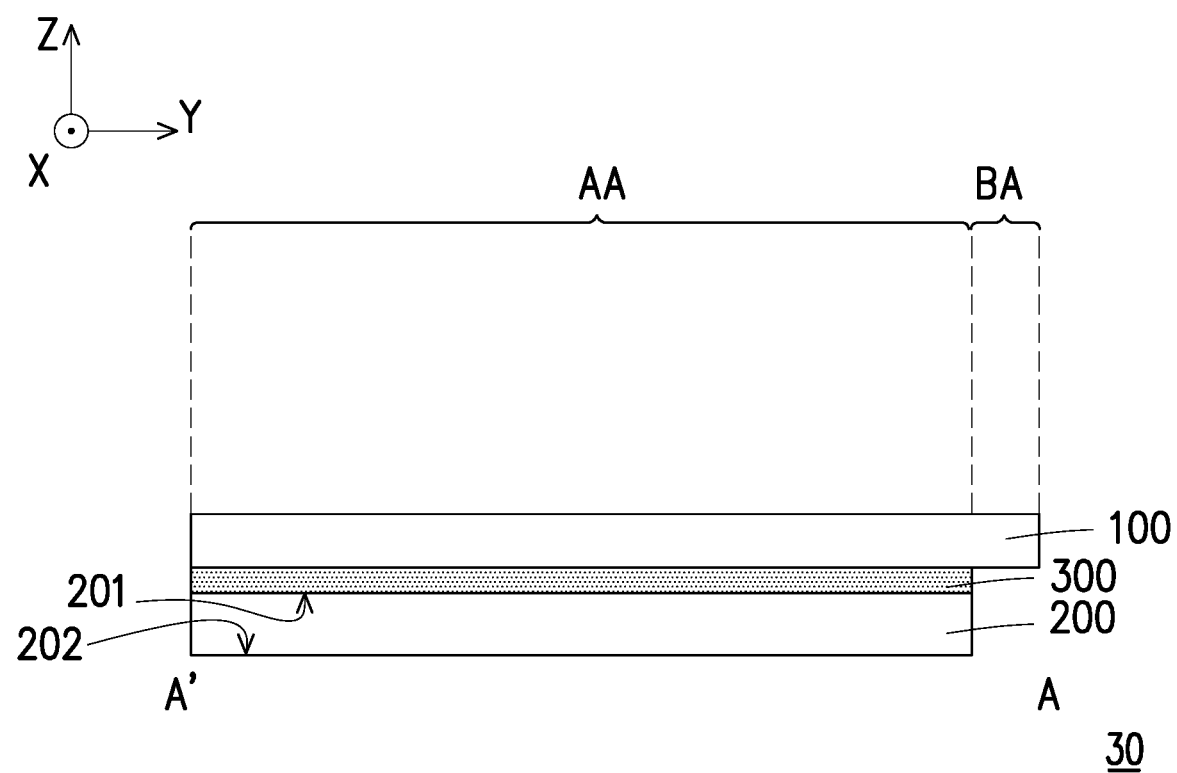
FIG. 11B is a schematic cross-sectional view of the vehicle window of FIG. 11A along a section line A-A'.

FIG. 11A is a schematic top view of a vehicle window according to an embodiment of the disclosure. FIG. 11B is a schematic cross-sectional view of the vehicle window of FIG. 11A along a section line A-A'. For clarity of the drawing and convenience of descriptions, several elements are omitted in FIG. 11A and FIG. 11B. In some embodiments, a window 30 is, for example, the aforementioned window or transparent display device used as a vehicle window. A relationship between the window 30 and a door frame 500 is briefly described below.

As shown in FIG. 11A, the window 30, for example, includes the door frame 500, the transparent substrate 100, and the transparent display panel 200. The door frame 500 may include a main body portion 510 substantially extending in an X-axis direction, a vertical portion 520 substantially extending in a Y-axis direction and connected to the main body portion 510, and an inclined portion 530 connecting the main body portion 510 and the vertical portion 520. The X-axis is perpendicular to the Y-axis, and the X-axis or the Y-axis is perpendicular to the Z-axis. The main body portion 510, the vertical portion 520, and the inclined portion 530 are, for example, a frame of the window 30, and may substantially surround an outer edge of the transparent substrate 100 (serving as the vehicle window). In some other embodiments, the transparent substrate 100 may be partially overlapped with the door frame 500. For example, the transparent substrate 100 may be partially overlapped with the main body portion 510 to be exhibited or stored during lifting or descending.

The transparent substrate 100 includes glass, quartz, sapphire, acrylic resin or other suitable materials, but the disclosure is not limited thereto. The transparent substrate 100 may include a display region AA and a non-display region BA. The display region AA and the non-display region BA may be defined by the outer edge surrounded by the main body portion 510, the vertical portion 520, and the inclined portion 530. The display region AA may be close to the main body portion 510 and the vertical portion 520. The non-display region BA may be located between the display region AA and the inclined portion 530, but the disclosure is not limited thereto.

According to the window 30 of an embodiment of the disclosure, the transparent display panel 200 is disposed on the display region AA of the transparent substrate 100. According to another perspective, the transparent display panel 200 may be attached to the transparent substrate 100 serving as a car window, and a region where the transparent display panel 200 is overlapped with the transparent substrate 100 is defined as the display region AA. A region where the transparent display panel 200 is not overlapped with the transparent substrate 100 is defined as the non-display region BA.

The display region AA and the transparent display panel 200 located on the display region AA may include a plurality of active regions PX. Referring to FIG. 1 and FIG. 11A, the active regions PX, for example, include a plurality of pixels having an image display function. Each active region PX may include a plurality of active devices TFT and display elements 400 shown in FIG. 7B to provide the image display function. The multiple active regions PX may be arranged in an array along the X-axis and the Y-axis, but the disclosure is not limited thereto. For example, the active regions PX may be arranged in a column along the Y-axis. Multiple columns may be sequentially arranged along the X-axis, but the disclosure is not limited thereto. In this way, the user may view an image pattern displayed on the transparent display panel 200 in the display region AA along the Z-axis.

Referring to FIG. 11B, the ultraviolet light shielding layer 300 of the window 30 is disposed between the transparent substrate 100 and the transparent display panel 200. For example, the ultraviolet light shielding layer 300 may be disposed on the first side 201 of the transparent display panel 200 to face the ambient light source (not shown, referring to FIG. 1). Under the above arrangement, the ultraviolet light shielding layer 300 may be completely overlapped with the transparent display panel 200 in the display region AA, or an area of the ultraviolet light shielding layer 300 may be selectively larger than an area of the transparent display panel 200, such that the ultraviolet light shielding layer 300 may be completely overlapped with the transparent display panel 200 in the display region AA. In other words, the ultraviolet light shielding layer 300 may be completely overlapped with the active region PX of the transparent display panel 200. In this way, the ultraviolet light irradiated to the transparent display panel 200 and the active region PX thereof may be reduced. Deterioration of the transparent display panel 200 and the electronic components therein caused by irradiation of ultraviolet light may be reduced. The window 30 may also achieve excellent technical effects similar to that of the aforementioned embodiments, and structural reliability or display quality is thereby improved.

In some other embodiments, the transparent substrate 100 may include the display region AA but may not include the non-display region BA. That is, the transparent display panel 200 may be completely overlapped with the transparent substrate 100, so that the entire transparent substrate 100 serving as the vehicle window provides a display function, but the disclosure is not limited thereto.

Figure 12:
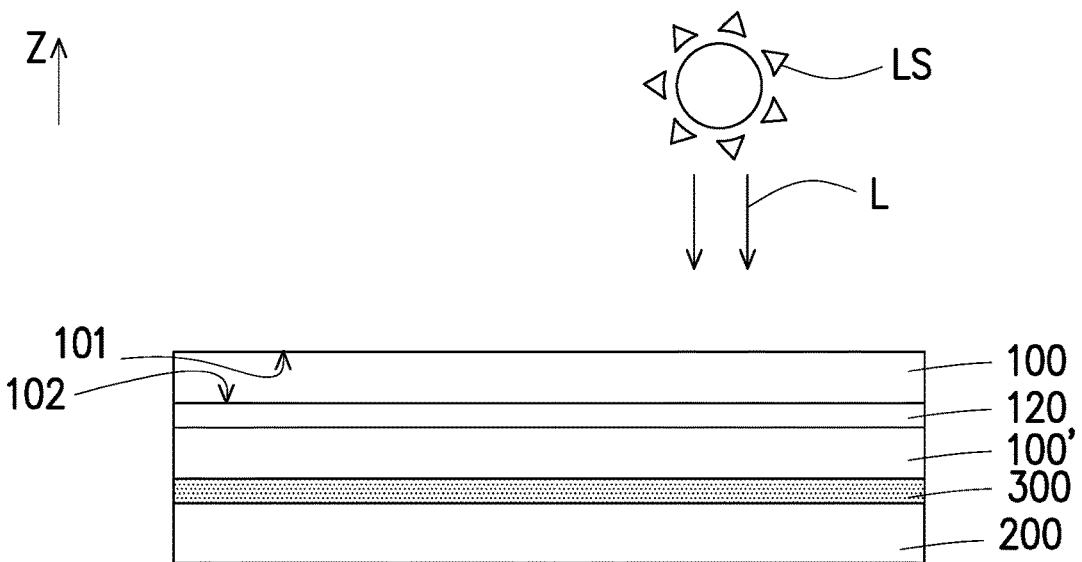
FIG. 12 is a schematic cross-sectional view of a window according to still another embodiment of the disclosure.

FIG. 12 is a schematic cross-sectional view of a window according to still another embodiment of the disclosure. For clarity of the drawing and convenience of descriptions, several elements are omitted in FIG. 12. A window 30A of the embodiment is substantially similar to the window 30 of FIG. 11B, so that the same and similar components in the two embodiments are not repeated. A main difference between the embodiment and the window 30 is that the window 30A further includes another transparent substrate. For example, the window 30A includes the first transparent substrate 100, a second transparent substrate 100', the ultraviolet light shielding layer 300, and the transparent display panel 200. The adhesive layer 120 may be selectively provided between the first transparent substrate 100 and the second transparent substrate 100'. Namely, the first transparent substrate 100, the adhesive layer 120 and the second transparent substrate 100' may constitute a glued substrate (or referred to as glued glass), but the disclosure is not limited thereto. The ultraviolet light shielding layer 300 is disposed between the second transparent substrate 100' and the transparent display panel 200. The ultraviolet light shielding layer 300 is located between the second side 102 of the first transparent substrate 100 and the transparent display panel 200.

Under the above arrangement, the ultraviolet light shielding layer 300 is located between the ambient light source LS and the transparent display panel 200. In this way, the ultraviolet light irradiated to the transparent display panel 200 may be reduced. Deterioration of the transparent display panel 200 and the electronic components therein caused by irradiation of ultraviolet light may be reduced. The window 30A may also achieve excellent technical effects similar to that of the aforementioned embodiments, and structural reliability or display quality is thereby improved.

Figure 13:
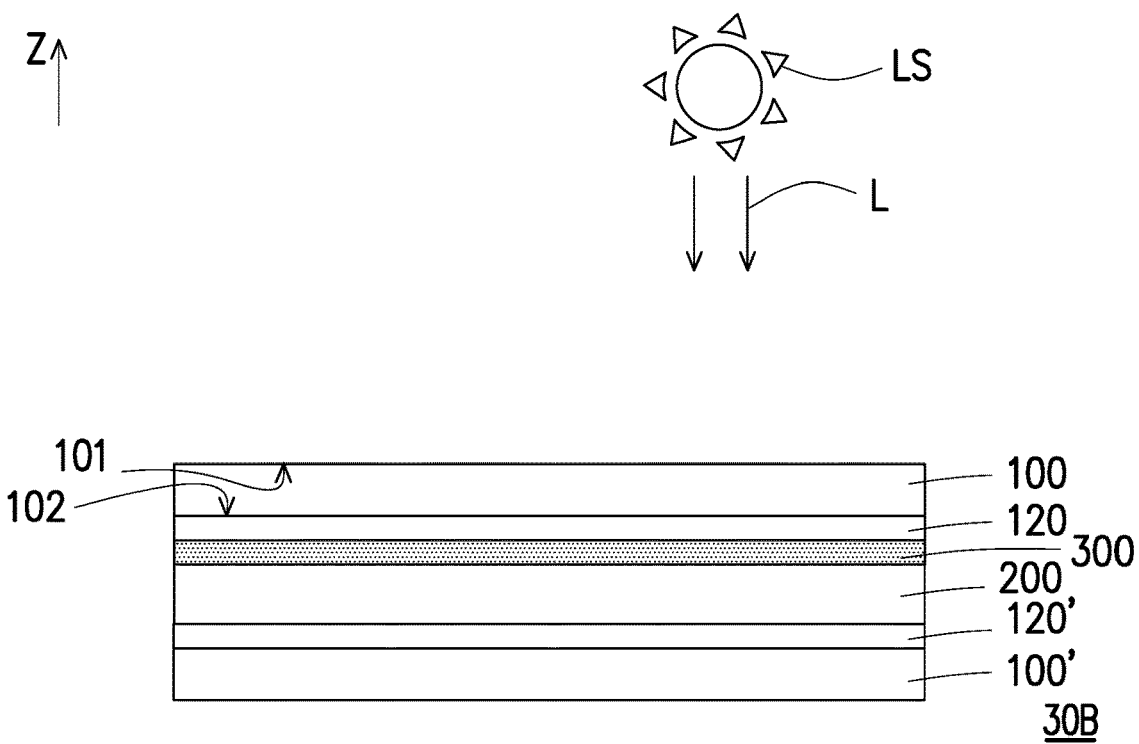
FIG. 13 is a schematic cross-sectional view of a window according to still another embodiment of the disclosure.

FIG. 13 is a schematic cross-sectional view of a window according to still another embodiment of the disclosure. For clarity of the drawing and convenience of descriptions, several elements are omitted in FIG. 13. A window 30B of the embodiment is substantially similar to the window 30 of FIG. 11B, so that the same and similar components in the two embodiments are not repeated. A main difference between the embodiment and the window 30 is that the window 30B further includes another transparent substrate, and the transparent display panel 200 is located between the two transparent substrates. For example, the window 30B includes the first transparent substrate 100, the second transparent substrate 100', the ultraviolet light shielding layer 300, and the transparent display panel 200. The adhesive layer 120 may be selectively provided on the second side 102 of the first transparent substrate 100. That is, the adhesive layer 120 is located between the first transparent substrate 100 and the transparent display panel 200. The ultraviolet light shielding layer 300 is located between the second side 102 of the first transparent substrate 100 and the transparent display panel 200. The transparent display panel 200 is located between the first transparent substrate 100 and the second transparent substrate 100'. In some embodiments, an adhesive layer 120' may be selectively disposed between the transparent display panel 200 and the second transparent substrate 100'. That is, the transparent display panel 200 may be located in a glued substrate (or referred to as glued glass) formed by the first transparent substrate 100, the adhesive layers 120, 120' and the second transparent substrate 100', but the disclosure is not limited thereto.

Under the above arrangement, the ultraviolet light shielding layer 300 is located between the ambient light source LS and the transparent display panel 200. In this way, the ultraviolet light irradiated to the transparent display panel 200 may be reduced. Deterioration of the transparent display panel 200 and the electronic components therein caused by irradiation of ultraviolet light may be reduced. The window 30B may also achieve excellent technical effects similar to that of the aforementioned embodiments, and structural reliability or display quality is thereby improved.

In view of the foregoing, in the window or the transparent display device of an embodiment of the disclosure, since the ultraviolet light shielding layer is completely overlapped with the active region of the transparent display panel and the ultraviolet light shielding layer may be completely located between the ambient light source and the transparent display panel, the incident light emitted by the ambient light source may first pass through the ultraviolet light shielding layer and then enters the transparent display panel. The ultraviolet wavelength of the incident light may be blocked by the ultraviolet light shielding layer. Therefore, the ultraviolet light in the incident light irradiated to the transparent display panel and the active region thereof may be reduced. In this way, deterioration of the transparent display panel and the electronic components in the active region thereof caused by irradiation of ultraviolet light may be reduced. Therefore, the structural reliability or display quality of the transparent display panel may be improved. In addition, the ultraviolet light shielding layer may be configured to support the transparent display panel. Therefore, the structural reliability of the transparent display panel may be improved. The overall structural reliability of the window or the transparent display device may be improved. The window or the transparent display device may exhibit good structural quality or display quality.

Note that the above embodiments are only used to illustrate, rather than limiting, the technical solutions of the disclosure. Although the disclosure has been described in detail with reference to the foregoing embodiments, it will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A window, comprising:
a transparent display panel, comprising:
- a substrate, having a first side and a second side opposite to the first side;
- a light-emitting element, disposed on the first side of the substrate;
- a thin film transistor, disposed on the first side of the substrate and is electrically connected to the light-emitting element; and
- a filling layer, disposed on the first side of the substrate and disposed on the light-emitting element, wherein the filling layer comprises a first portion and a second portion, the first portion overlaps the light-emitting element and the thin film transistor in a normal direction of the substrate, and the second portion does not overlap the light-emitting element and the thin film transistor in the normal direction of the substrate;

a transparent substrate, disposed on the second side of the substrate; and
an ultraviolet light shielding layer, disposed on the second side of the substrate and disposed between the transparent substrate and the transparent display panel, wherein the transparent substrate comprises a display region and a non-display region, the non-display region of the transparent substrate does not overlap with the transparent display panel in the normal direction of the substrate, and a Young's modulus of the ultraviolet light shielding layer is different from a Young's modulus of the transparent display panel,
wherein a first minimum distance between the first portion and the ultraviolet light shielding layer is greater than a second minimum distance between the second portion and the ultraviolet light shielding layer, and
wherein the second minimum distance is less than a third minimum distance between the light-emitting element and the ultraviolet light shielding layer.

2. The window according to claim 1, wherein the transparent display panel including liquid crystal layer, organic light-emitting diode, or light-emitting diode.

3. The window according to claim 1, wherein a width of the transparent substrate along a direction perpendicular to the normal direction of the substrate is greater than a width of the transparent display panel along the direction perpendicular to the normal direction of the substrate.

4. The window according to claim 3, further comprising a frame partially overlapped with the transparent substrate.

5. The window according to claim 1, wherein the ultraviolet light shielding layer blocks light with a wavelength greater than or equal to 200 nm and less than or equal to 400 nm.

6. The window according to claim 1, wherein a thickness of the ultraviolet light shielding layer is greater than or equal to a thickness of the transparent display panel.

7. The window according to claim 1, wherein a thickness of the substrate in a Z-axis direction is 30 μm to 200 μm.

8. The window according to claim 1, further comprising a transparency adjustable panel disposed on the second side of the substrate and disposed between the transparent display panel and the ultraviolet light shielding layer.

9. The window according to claim 1, wherein the non-display region of the transparent substrate at least partially overlaps with a door frame.

* * * * *